(12) United States Patent
Hergenhan et al.

(10) Patent No.: US 7,233,013 B2
(45) Date of Patent: Jun. 19, 2007

(54) RADIATION SOURCE FOR THE GENERATION OF SHORT-WAVELENGTH RADIATION

(75) Inventors: Guido Hergenhan, Jena (DE); Kai Gaebel, Jena (DE); Thomas Brauner, Jena (DE)

(73) Assignee: XTREME Technologies GmbH, Jena (DE)

( * ) Notice: Subject to any disclaimer, the term of this patent is extended or adjusted under 35 U.S.C. 154(b) by 0 days.

(21) Appl. No.: 11/393,325

(22) Filed: Mar. 30, 2006

(65) Prior Publication Data

US 2006/0219959 A1  Oct. 5, 2006

(30) Foreign Application Priority Data

Mar. 31, 2005  (DE) .............. 10 2005 015 274

(51) Int. Cl.
*G01J 3/10* (2006.01)
*G01J 1/00* (2006.01)
*H05G 2/00* (2006.01)
*H01J 65/04* (2006.01)

(52) U.S. Cl. .............. 250/504 R; 250/493.1; 378/34

(58) Field of Classification Search .......... 250/504 R; 378/34
See application file for complete search history.

(56) References Cited

U.S. PATENT DOCUMENTS

| | | | |
|---|---|---|---|
| 6,506,253 B2* | 1/2003 | Sakuma | 118/620 |
| 6,586,757 B2 | 7/2003 | Melnychuk et al. | |
| 6,972,421 B2* | 12/2005 | Melnychuk et al. | 250/504 R |
| 7,049,614 B2* | 5/2006 | Rice | 250/504 R |
| 7,080,563 B2* | 7/2006 | Fujimoto | 73/861 |
| 7,164,144 B2* | 1/2007 | Partlo et al. | 250/504 R |
| 7,167,232 B2* | 1/2007 | Banine et al. | 355/53 |
| 2002/0035962 A1* | 3/2002 | Sakuma | 118/50.1 |
| 2004/0108473 A1* | 6/2004 | Melnychuk et al. | 250/504 R |
| 2004/0178365 A1* | 9/2004 | Rice | 250/492.2 |
| 2005/0115333 A1* | 6/2005 | Fujimoto | 73/861 |
| 2005/0139785 A1* | 6/2005 | Banine et al. | 250/492.2 |
| 2005/0199829 A1* | 9/2005 | Partlo et al. | 250/504 R |
| 2005/0230645 A1* | 10/2005 | Melnychuk et al. | 250/504 R |
| 2006/0017026 A1* | 1/2006 | Hergenhan et al. | 250/504 R |
| 2006/0043319 A1* | 3/2006 | Gaebel et al. | 250/504 R |
| 2006/0226377 A1* | 10/2006 | Hergenhan et al. | 250/493.1 |
| 2006/0243927 A1* | 11/2006 | Tran et al. | 250/504 R |
| 2006/0273732 A1* | 12/2006 | Korobochko et al. | 315/111.21 |

FOREIGN PATENT DOCUMENTS

| | | |
|---|---|---|
| EP | 1 329 772 | 7/2003 |
| EP | 1 396 758 | 8/2003 |
| EP | 1 434 095 | 6/2004 |

* cited by examiner

*Primary Examiner*—Nikita Wells
*Assistant Examiner*—Bernard Souw
(74) *Attorney, Agent, or Firm*—Reed Smith LLP

(57) ABSTRACT

In a radiation source for the generation of short-wavelength radiation, it is the object of the invention to effectively increase the protection of the collimator optics by a buffer gas without substantially reducing the radiation transmission. A vacuum chamber which encloses a radiation-emitting plasma and is outfitted with at least one feed line and one outlet line for a buffer gas in order to ensure protection against debris for at least one optical element which directs the radiation to a radiation outlet opening in the vacuum chamber has chamber areas with particle deceleration of varying magnitude by the buffer gas. The particle deceleration is greater at least in a first chamber area in which the optical element is arranged than in any other chamber area.

9 Claims, 1 Drawing Sheet

RADIATION SOURCE FOR THE GENERATION OF SHORT-WAVELENGTH RADIATION

CROSS-REFERENCE TO RELATED APPLICATION

This application claims priority of German Application No. 10 2005 015 274.0, filed Mar. 31, 2005, the complete disclosure of which is hereby incorporated by reference.

BACKGROUND OF THE INVENTION a) Field of the Invention

The invention is directed to a radiation source for the generation of short-wavelength radiation in which a radiation-emitting plasma is enclosed by a vacuum chamber that is outfitted with at least one feed line and one outlet line for a buffer gas in order to ensure protection against debris for at least one optical element which directs the radiation to a radiation outlet opening in the vacuum chamber.

b) Description of the Related Art

Apart from a desired short-wavelength radiation, plasma-based radiation sources, in particular plasmas which are excited by laser radiation, also emit high-energy particles (debris) which can lead to damage and to curtailment of the life of the optical elements, particularly collector optics, that are provided for utilization of the radiation.

When using a buffer gas reduce debris, depending on the density of the buffer gas and on the length of the optical path, a significant portion of the desired radiation is absorbed along the path that must be traversed by the radiation emitted by the plasma through the buffer gas before reaching the intended area via the collector optics which are constructed as reflection optics. As a result, the efficiency of the radiation source is reduced.

In addition, the conflict between improved protection and increased absorption loss arising when buffer gas density is increased is aggravated by the demand for providing a very large divergence angle of the beam bundle in one direction from the plasma to the collector optics but only a small divergence angle in the opposite direction (from the plasma to the intermediate focus of the collector optics).

A compromise with respect to the buffer gas density which takes into account the requirement for adequate protection while keeping absorption losses within reason is not an acceptable solution because the efficiency of the radiation source is the primary aim of development.

Another unsatisfactory solution is presented in EP 1 329 772 A2 in which the priority is to prevent a mixing of the buffer gas with the work gas and in which the plasma source and optical element are separated from one another spatially by an area through which a flow of buffer gas, e.g., argon, is directed perpendicular to the radiating direction.

OBJECT AND SUMMARY OF THE INVENTION

On this basis, it is the primary object of the invention to effectively increase the protection of the collimator optics by a buffer gas without substantially reducing the radiation transmission.

In the radiation source of the above-mentioned type for the generation of short-wavelength radiation, the above-stated object is met, according to the invention, in that the vacuum chamber has chamber areas with particle deceleration of varying magnitude by means of the buffer gas, and in that the particle deceleration is greater at least in a first chamber area in which the optical element is arranged than in any other chamber area.

Instead of a compromise with respect to the buffer gas density in order to ensure sufficient protection while maintaining reasonable absorption losses, the invention is based on providing a varying degree of protection that is adapted to the functional elements by forming partial spaces with different protection criteria.

There are different arrangements for generating varying degrees of particle deceleration in the chamber areas.

In a first constructional variant, the chamber areas have different buffer gas densities, the highest buffer gas density being present in the chamber area in which the optical element is arranged.

It is advantageous when the feed line for the buffer gas has a plurality of partial lines whose gas outlet openings at the surface of the optical element exit in direction of the plasma so that the buffer gas density is higher in the vicinity of the optical element than in the remaining space of the vacuum chamber.

As an alternative to the arrangement mentioned above, the vacuum chamber can have two chamber areas located next to one another, a first chamber area which contains the plasma and optical element being separated from a second chamber area with the radiation outlet opening by flow resistance which passes radiation. Through the connection of the feed line for the buffer gas to the first chamber area and the connection of the outlet line for the buffer gas to the second chamber area, which outlet line communicates with a pump device, there is a density gradient between the two chamber areas when the second chamber area is pumped out through the flow resistance so that the buffer gas density is higher in the first chamber area than in the second chamber area.

Further, the invention can be constructed in such a way that a coil arrangement, e.g., a pair of Helmholtz coils or a permanent magnet, is arranged in the chamber area in which the optical element is located in order to generate a magnetic field whose magnetic field lines are directed perpendicular to the optical axis of the optical element.

The ratio of the distances from the plasma to the optical element and from the plasma to the radiation outlet opening is advantageously greater than 1:6 in order to achieve different opening angles proceeding from the plasma in direction of the optical element and in direction of the radiation outlet opening.

The invention will be described more fully in the following with reference to the schematic drawings.

DESCRIPTION OF THE PREFERRED EMBODIMENTS

Figure 1:
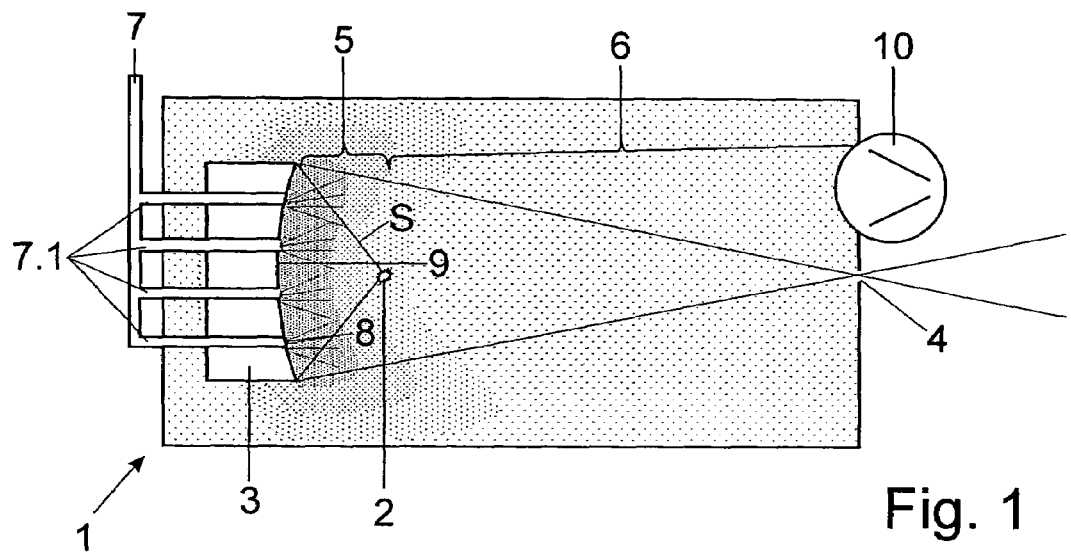
FIG. 1 shows a radiation source with a buffer gas feed through the optical element.

The radiation source shown in FIG. 1 contains, in a vacuum chamber 1, a plasma 2 which is induced by laser radiation. The radiation S emitted by the plasma 2 is directed to a radiation outlet opening 4 in the vacuum chamber 1 by means of an optical element which is arranged in the vacuum chamber 1 and constructed as a collector mirror 3. An intermediate focus is generated by imaging the plasma 2 with the collector mirror 3, this intermediate focus being localized in the radiation outlet opening 4 and serving as an interface to exposure optics in a semiconductor exposure installation for which the radiation source, preferably designed for the EUV wavelength region, is provided. The laser and the target flow to which the laser radiation is directed for generating the plasma 2 are not shown.

Up to the collector mirror 3, the radiation S emitted by the plasma 2 traverses a path on which high-energy particles that are likewise given off from the plasma 2 are decelerated through collision with the atoms of the buffer gas to the extent that damage to the collector mirror 3 is prevented.

Radiation S is absorbed by the buffer gas on the path from the plasma 2 to the collector mirror 3 as well as on the path from the collector mirror 3 to the radiation outlet opening 4, but with the distinction that the absorption is progressively reduced as a result of a particle deceleration which varies in magnitude due to different density areas until reaching the radiation outlet opening 4.

Since the kinetic energy of the high-energy particles from the plasma 2 decreases exponentially with the distance and the density of the buffer gas as described by:

$$E_{kin}(s,\rho_0) \Box e^{-\rho_0 \cdot s},$$

the distance from the plasma 2 to the collector mirror 3 and the density of the buffer gas $\rho_0$ (with homogeneous distribution) are selected in such a way that the particles with the greatest initial energy which still occur to a significant extent are thermalized after traversing the distance.

When $\rho_0 \cdot a = \kappa$, the transmission of radiation is $$T = e^{-a \cdot \rho_0 \cdot (a+b)}.$$

In the arrangement shown in FIG. 1, chamber areas 5, 6 with different buffer gas densities are generated in that a feed line 7 which is provided in the vacuum chamber 1 for the buffer gas is divided into a plurality of partial lines 7.1 which are guided through the collector mirror 3 and exit the mirror surface 9 as gas outlet openings 8. Of course, the surface of the gas outlet openings 8 must be small compared to the mirror surface 9. Since the buffer gas is supplied continuously and is pumped out by a vacuum pump 10, this results in a gas flow whose buffer gas density $\rho(s)$ in chamber area 5 with a density maximum at the mirror surface 9 is higher than in chamber area 6 which extends from the plasma 2 up to the radiation outlet opening 4.

The buffer gases to be considered are principally inert gases or gases that form a gaseous or non-adhesive connection with the participating reaction products, e.g., target material. Further, the buffer gases should have a low absorption at the necessary gas density in the desired wavelength region. It is preferable to use Argon, which has the best characteristics with respect to the deceleration of particles with low radiation absorption.

The pumping rate for the buffer gas should be geared to a smallest possible proportion of the work medium, e.g., xenon, that is continuously supplied through a feed line, not shown, and should be selected so as to be correspondingly high because xenon has a high self-absorption particularly for EUV radiation.

Figure 2:
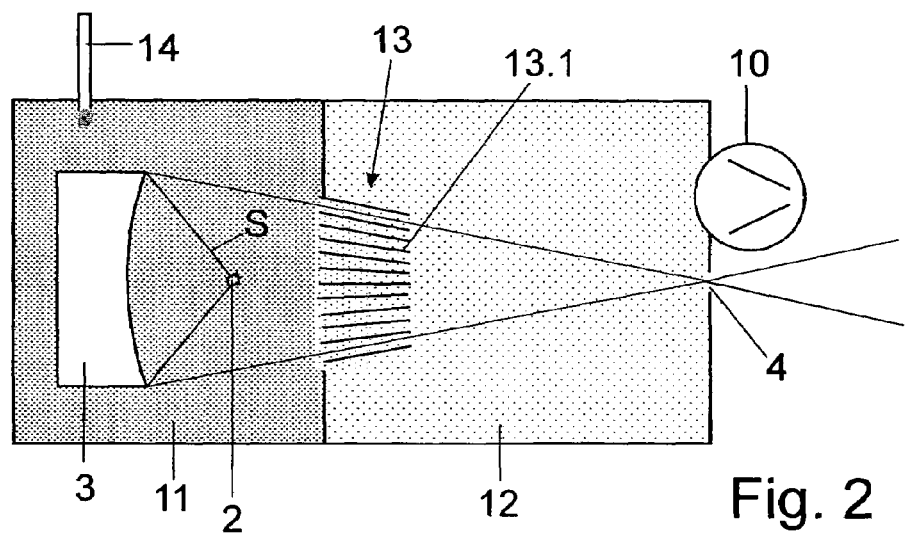
FIG. 2 shows a radiation source with flow resistance between adjacent chamber areas.
Figure 3:
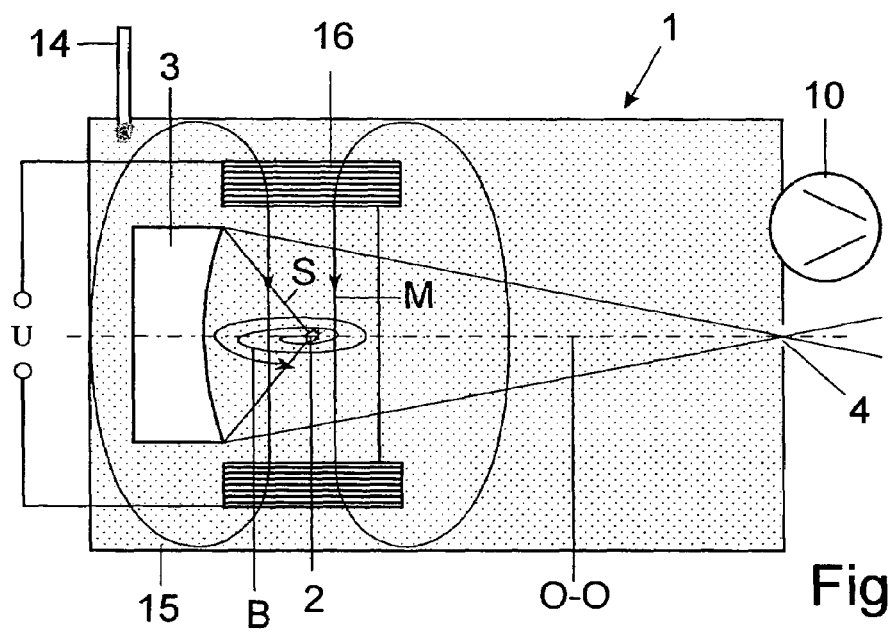
FIG. 3 shows a radiation source which is filled with buffer gas and which is penetrated by a magnetic field for deflecting charged particles.

In a second arrangement according to FIG. 2, two chamber areas 11, 12 arranged next to one another are produced by spatially dividing the vacuum chamber 1 by means of a member that presents an appreciable flow resistance for the buffer gas, which allows the radiation propagating in a straight line to pass unimpeded apart from the geometric vignetting.

The member, designated as flow resistance 13, is advantageously arranged equidistant from the plasma 2 and the collimator mirror 3.

A feed line 14 for the buffer gas is provided in the chamber area 11 in which the collector mirror 3 is located. A vacuum pump 10 by which the buffer gas is removed from the vacuum chamber 1 again at a high pump-out rate is connected to the other chamber area 12.

In this way, a high buffer gas density for efficient deceleration of high-energy particles with a spatially limited higher absorption is again ensured in the chamber area 11 with the collector mirror 3 and a lower buffer gas density with minimized absorption along the optical path is ensured in the other chamber area 12.

An arrangement of the type described above is especially important when the lower absorption in chamber area 12 makes up for the losses from geometric vignetting due to the flow resistance 13.

The flow resistance 13 can be formed, for instance, from a lattice of small glass tubes (capillary array) or from specially arranged plates (foil trap) with an orientation of the plates that runs parallel to the radiation direction. For the sake of clarity, only one of the plates, designated by 13.1, is shown.

In a third construction of the invention, the vacuum chamber 1, particularly a chamber area 15 in which the collector mirror 3 is located, is penetrated additionally by a magnetic field which is generated, e.g., by a Helmholtz coil 16 and whose magnetic field lines M are directed perpendicular to the optical axis O—O, so that the high-energy particles exiting the plasma as ions are forced along an orbit B (circular or helical orbit) that is longer than the geometric distance from the plasma 2 to the collector mirror 3. Accordingly, a lower overall buffer gas density is sufficient for a greater particle deceleration through an increase in the number of collisions with the buffer gas atoms because only the path of the particles, but not the path of the radiation, is increased.

While the foregoing description and drawings represent the present invention, it will be obvious to those skilled in the art that various changes may be made therein without departing from the true spirit and scope of the present invention.

What is claimed is:

1. A radiation source for the generation of short-wavelength radiation, comprising:
   a radiation-emitting plasma being enclosed by a vacuum chamber;
   said vacuum chamber being outfitted with at least one feed line and one outlet line for a buffer gas in order to ensure protection against debris for at least one optical element which directs the radiation to a radiation outlet opening in the vacuum chamber;
   said vacuum chamber having chamber areas with particle deceleration of varying magnitude by the buffer gas; and
   wherein the particle deceleration being greater at least in a first chamber area in which the optical element is arranged than in any other chamber area.

2. The radiation source according to claim 1, wherein the chamber areas in which there is a particle deceleration of varying magnitude have different buffer gas densities, wherein the highest buffer gas density is present in the chamber area in which the optical element is arranged.

3. The radiation source according to claim 2, wherein the feed line for the buffer gas has a plurality of partial lines whose gas outlet openings at the surface of the optical element exit in direction of the plasma.

4. The radiation source according to claim 1, wherein the vacuum chamber has two chamber areas located next to one another, a first chamber area which contains the plasma and optical element is separated from a second chamber area with the radiation outlet opening by flow resistance which passes radiation.

5. The radiation source according to claim 4, wherein the feed line for the buffer gas is connected to the first chamber area and the outlet line for the buffer gas, which communicates with a pump device, is connected to the second chamber area.

6. The radiation source according to claim 1, wherein a coil arrangement is arranged in the chamber area in which the optical element is located in order to generate a magnetic field whose magnetic field lines are directed perpendicular to the optical axis of the optical element.

7. The radiation source according to claim 6, wherein the coil arrangement is formed of a pair of Helmholtz coils.

8. The radiation source according to claim 6, wherein a permanent magnet is provided for the coil arrangement.

9. The radiation source according to claim 1, wherein the ratio of the distances from the plasma to the optical element and from the plasma to the radiation outlet opening is greater than 1:6.

* * * * *